United States Patent [19]
Yoshimura

[11] Patent Number: 5,394,300
[45] Date of Patent: Feb. 28, 1995

[54] THIN MULTILAYERED IC MEMORY CARD

[75] Inventor: Yoshimasa Yoshimura, Itami, Japan

[73] Assignee: Mitsubishi Denki Kabushiki Kaisha, Tokyo, Japan

[21] Appl. No.: 2,807

[22] Filed: Jan. 11, 1993

[30] Foreign Application Priority Data

Sep. 4, 1992 [JP] Japan .................................. 4-237185

[51] Int. Cl.[6] .............................................. H05K 1/14
[52] U.S. Cl. .................................... 361/737; 361/744;
361/752; 361/761; 361/810; 257/686; 439/69;
439/74
[58] Field of Search ............... 361/393, 395, 396, 397,
361/394, 399, 400, 412, 413, 417, 405, 420, 728,
729, 736, 737, 744, 748, 752, 760, 761, 784, 785,
792, 807, 810; 257/723, 724, 686; 439/60-65,
68, 69, 73, 74

[56] References Cited
U.S. PATENT DOCUMENTS 5,061,990 10/1991 Arakawa et al. ..................... 357/80
5,191,404 3/1993 Wu et al. ............................. 257/724

Primary Examiner—Leo P. Picard
Assistant Examiner—Young Whang
Attorney, Agent, or Firm—Leydig, Voit & Mayer

[57] ABSTRACT

In an IC memory card, sub-modules, in each of which a plurality of memory ICs are mounted on each of two opposed surfaces of a sub-substrate, are mounted on each of two opposed surfaces of a single substrate. Since the number of substrates connected to a connector is one, soldering of the connector is facilitated, and the structure of the connector can be simplified. Furthermore, in an IC memory card, the sub-modules may be mounted on the substrate in such a manner that they are stacked in two stages at an opening in the substrate. In this way, the thickness of the IC memory card can be minimized. Also, the use of the die bonding process makes connection between the sub-module and the substrate easy.

11 Claims, 6 Drawing Sheets

THIN MULTILAYERED IC MEMORY CARD

BACKGROUND OF THE INVENTION

1. Field of the Invention

This invention relates to an IC memory card and more particularly, to an IC memory card having a structure which increases in the capacity thereof.

2. Description of the Related Art

A super-thin IC package, a TCP (tape carrier package), is a package which has been developed recently to provide an IC memory card having a large capacity. This package has achieved a thickness about half the thickness of an IC package called a TSOP (thin small outline package). The use of TCP enables four ICs to be stacked on top of one another in a thickness of 3.3 mm which is the standard thickness of the IC memory card specified by Japan Electronic Industry Association.

FIGS. 11 and 12 are respectively schematic plan and side elevational views illustrating a conventional IC memory card which employs TCP. In these figures, ICs which employ TCP, e.g., memory ICs 2, are mounted on the two surfaces of a substrate 1. A connector 3 is connected to the side portion of the substrate 1 for electrically connecting the memory ICs to an external circuit.

The IC memory card arranged in the manner described above suffers from the following problems. That is, (1) since the substrates 1 are laid on top of one another in two stages, the connector 3 has complicated form and structure. (2) Soldering of the connector 3 to the substrates 1 is difficult. (3) Since the substrates 1 in the upper and lower stages are separated from each other, they are susceptible to noises. (4) Mixed mounting of conventional IC packages called TSOP and TCPs is impossible.

SUMMARY OF THE INVENTION

Accordingly, an object of the present invention is to provide an IC memory card having a structure of TCPs stacked on top of one another in four stages.

In order to achieve the above object, according to one aspect of the present invention, there is provided an IC memory card which comprises sub-modules in each of which a plurality of memory ICs are mounted on two surfaces of a sub-substrate, a substrate with the sub-modules mounted on two surfaces thereof, and a connector provided at an end portion of the substrate, the connector being electrically connected to the memory ICs, for exchanging signals with an external device.

According to another aspect of the present invention, there is provided an IC memory card which comprises submodules in each of which a plurality of memory ICs are mounted on two surfaces of a sub-substrate, a substrate having an opening, the sub-modules being stacked in two stages at the opening, and a connector provided at an end portion of the substrate, the connector being electrically connected to the memory ICs, for exchanging signals with an external device.

DETAILED DESCRIPTION OF THE PREFERRED EMBODIMENTS

First Embodiment

Figure 1:
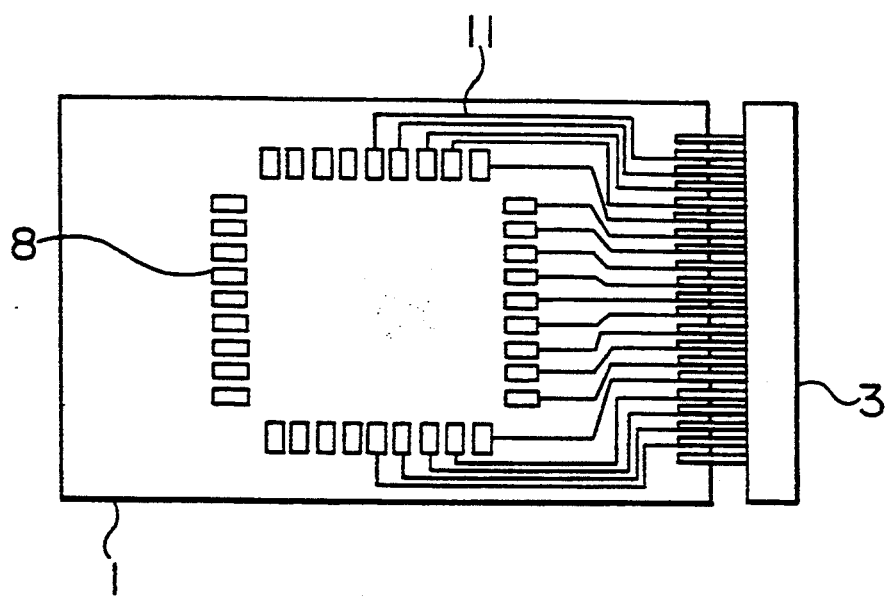
FIG. 1 is a plan view of a substrate of an IC memory card illustrating a first embodiment of the present invention.
Figure 2:
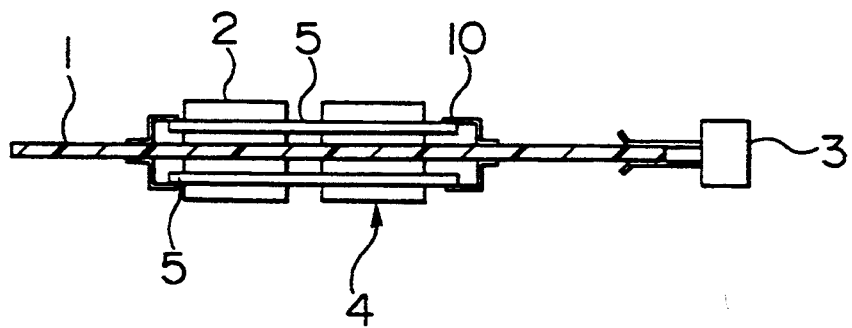
FIG. 2 is a side elevational view of the IC memory card of FIG. 1.
Figure 3:
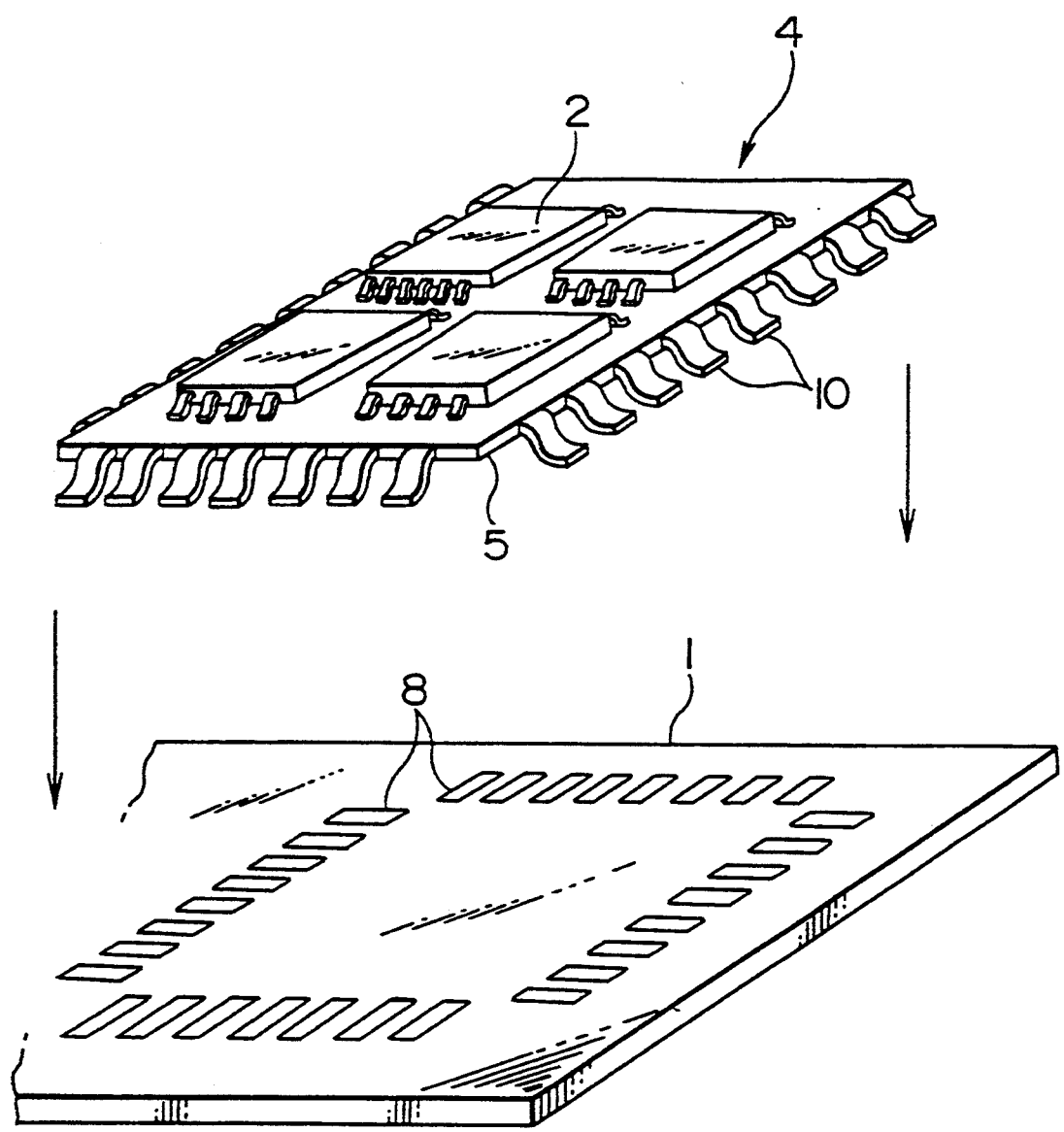
FIG. 3 is a perspective view of the IC memory card of FIG. 1.

FIG. 1 is a plan view of a substrate of an IC memory card showing a first embodiment of the present invention. FIG. 2 is a side elevational view of the IC memory card of FIG. 1. Identical reference numerals in these figures represent similar or identical elements. In these figures, memory ICs 2 employing TCP are mounted on each of the two opposed surfaces of each of two sub-substrates 5 to form sub-modules 4. The submodules 4 are mounted on each of the two opposed surfaces of the substrate 1 through leads 10. On the substrate 1 are formed pads 8. The pads 8 are connected to signal lines 11 from the connector 3. The pads 8 are also connected to the leads 10 of each of the sub-modules 4. The connector 3 is connected to the side portion of the substrate 1. FIG. 3 illustrates the mounting of the sub-modules 4 on the substrate 1.

In the IC memory card arranged in the manner described above, since the single substrate is connected to the connector 3, soldering is facilitated. Also, the structure of the connector can be simplified. Furthermore, the number of sub-modules to be mounted on the IC memory card can be altered depending on the memory capacity of the memory card, and the sub-module can be handled as the single memory IC. Consequently, circuit designing is made easy. Furthermore, the length or electrical capacity of the signal lines 11 can be adjusted equivalently between the sub-modules 4 by adjusting the position of mounting of the sub-modules 4, so that variations in the timing between the signals can be restricted.

Second Embodiment

Figure 4:
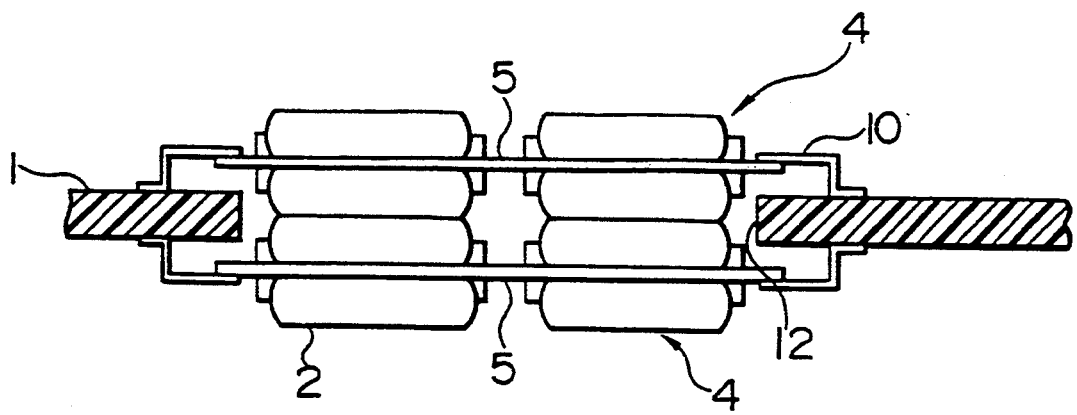
FIG. 4 is a side elevational view of sub-modules of an IC memory card showing a second embodiment of the present invention.

In the first embodiment, the total thickness of the IC memory card is the thickness of the two sub-modules 4 plus the thickness of the substrate 1. In a second embodiment, as shown in FIG. 4, an opening 12 is formed in the substrate 1 at a position where the sub-modules 4 are to be mounted, and the sub-modules 4 are mounted in two stages at that opening 12. An IC memory card having a minimum thickness can be obtained by using the substrate 1 having the aforementioned structure.

Third Embodiment

Figure 5:
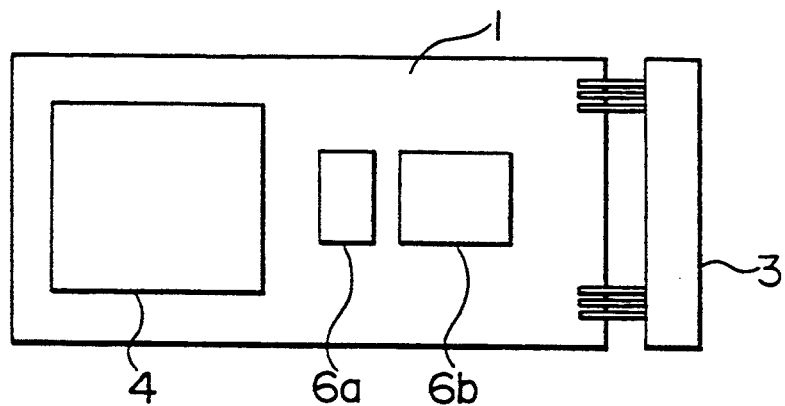
FIG. 5 is a plan view of the IC memory card showing a third embodiment of the present invention.
Figure 6:
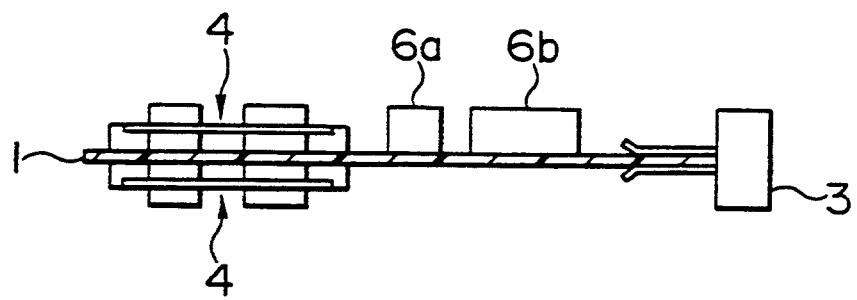
FIG. 6 is a side elevational view of the IC memory card of FIG. 5.

In the first and second embodiments, the signal lines 11 from the connector 3 are connected directly to the pads 8. In a third embodiment, a power supply control IC 6a and a memory control IC 6b are connected between the connector 3 and the pads 8 on the substrate 1, as shown in FIGS. 5 and 6. This structure allows ICs which do not employ TCP, such as the power supply control IC 6a, to be mounted on the substrate together with the ICs employing TCP in a mixed state, and thus provides a memory card having many functions.

Fourth Embodiment

Figure 7:
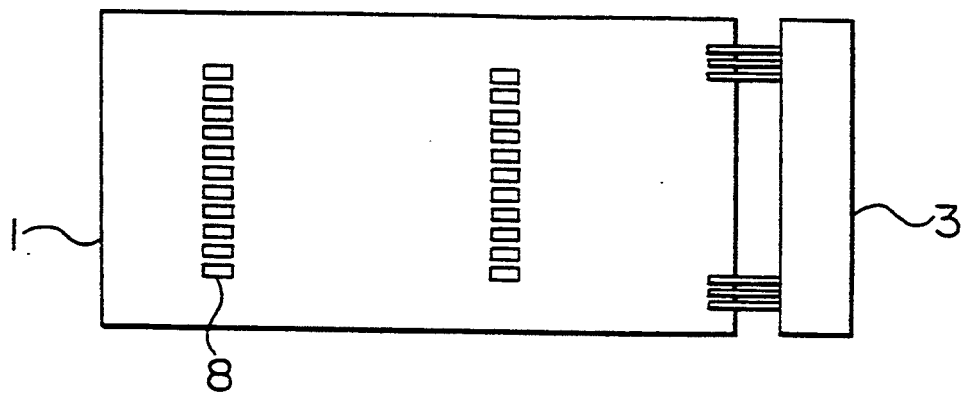
FIG. 7 is a plan view of a substrate of an IC memory card showing a fourth embodiment of the present invention.
Figure 8:
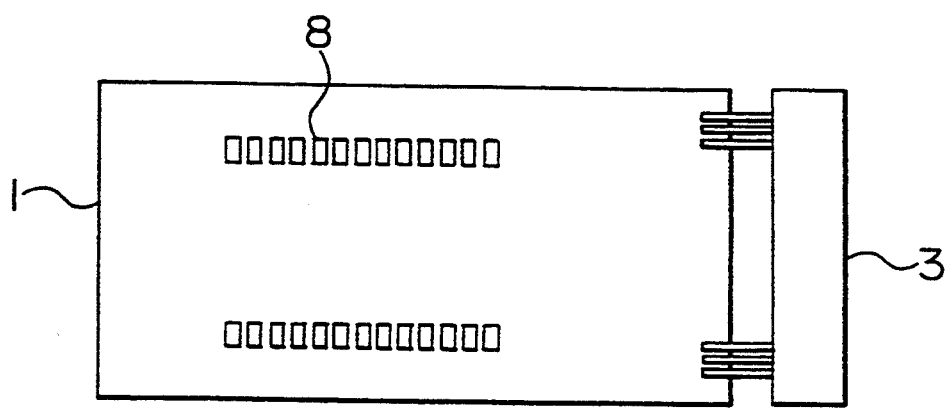
FIG. 8 is a plan view of the substrate of the IC memory card showing the fourth embodiment of the present invention.

In the first through third embodiments, the pads 8 are disposed on the four sides of the substrate 1. In a fourth embodiment, the pads 8 are disposed on the two sides of the substrate in either the longitudinal or lateral direction, as, shown in FIGS. 7 and 8. In this way, the strength with which the substrate 1 resists twisting can be increased.

Fifth Embodiment

Figure 9:
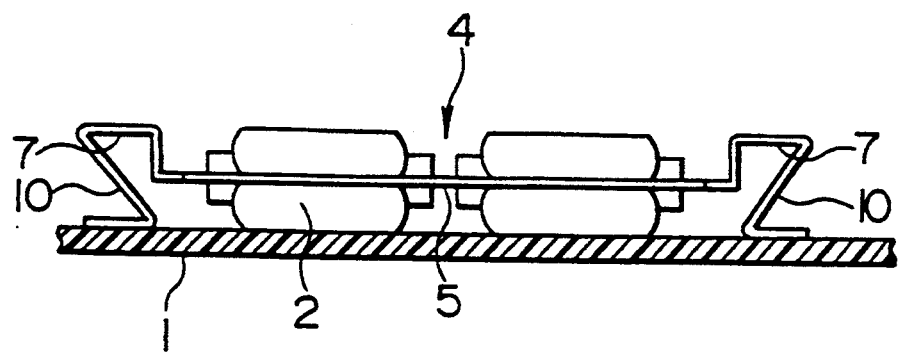
FIG. 9 is a side elevational view of sub-modules of an IC memory card showing a fifth embodiment of the present invention.

The first through fifth embodiments employ gullwing leads 10 to connect each of the sub-modules 4 to the substrate 1. In a fifth embodiment, leads 10, each of which has an elastic retaining portion 7, are used to absorb distortion due to thermal expansion or external stress, as shown in FIG. 9.

Sixth Embodiment

Figure 10:
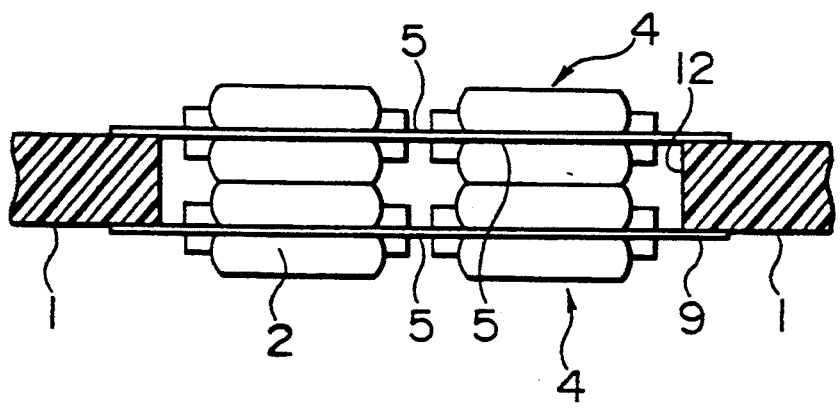
FIG. 10 is a side elevational view of sub-modules of an IC memory card showing a sixth embodiment of the present invention.
Figure 11:
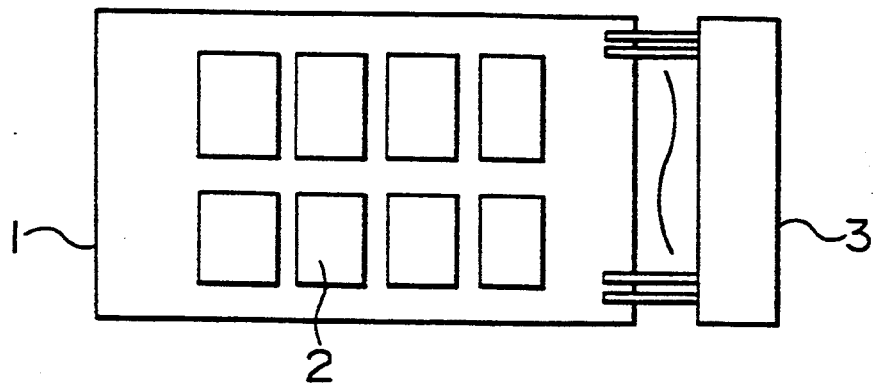
FIG. 11 is a plan view of a conventional IC memory card.
Figure 12:
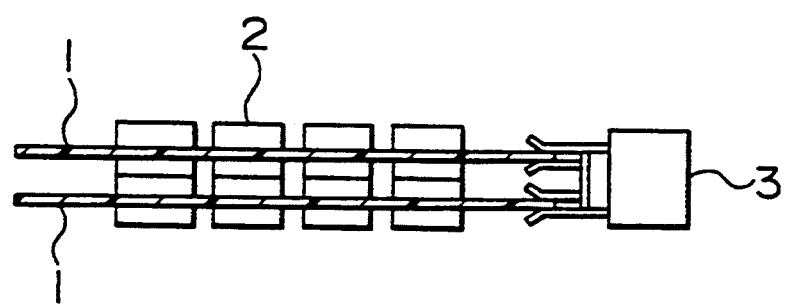
FIG. 12 is a side elevational view of the conventional IC memory card.

In the first through fourth embodiments, the leads 10 are provided on the sub-module 4. In a sixth embodiment, pads 9 on the sub-substrate 5 are connected directly to the pads 8 on the substrate 1 by soldering using the die bonding process, as shown in FIG. 10. At that time, the thickness of the substrate 1 is made equal to the thickness of the two memory ICs 2, and the substrate 1 is drilled to form the opening 12. The sub-modules 4 are buried in the opening 12. In this way, connection between the sub-modules 4 and the substrate 1 is facilitated.

As will be understood from the foregoing description, in the present invention, the sub-modules in each of which a plurality of memory ICs are mounted on each of two opposed surfaces of the sub-substrate are mounted on each of two opposed surfaces of a single substrate. Consequently, in an IC memory card in which the ICs employing TCP are stacked on top of one another in four stages, connection between the connector and the substrate is facilitated and the structure of the connector is simplified as compared with a conventional structure which employs two substrates. Furthermore, since conventional ICs employing TSOP, such as a power supply control IC or a memory control IC, can be mounted together with the ICs employing TCP in a mixed state, a sophisticated memory card can be produced. Furthermore, since the length or electrical capacity between the sub-modules can be made equivalent, variations in the timing of the signals can be restricted. Furthermore, since the number of sub-modules to be mounted can be altered depending on the memory capacity of the IC card and the sub-module can be handled as a single memory IC, circuit designing is facilitated.

Furthermore, since the sub-modules are mounted in two stages in an opening in the substrate, the thickness of the IC memory card can be minimized. Furthermore, the use of the die bonding process makes connection between the sub-module and the substrate easy.

What is claimed is:

1. An IC memory card comprising:
    two sub-modules, each sub-module including a sub-substrate having two opposed surfaces and a plurality of memory ICs mounted on the two opposed surfaces of the sub-substrate;
    a substrate having two opposed surfaces on which the sub-modules are mounted wherein all memory ICs mounted on surfaces of sub-substrates facing the substrate contact the substrate; and
    a connector mounted at an end of the substrate and electrically connected to said memory ICs for exchanging signals with an external device.

2. The IC memory card according to claim 1 wherein said memory ICs are tape carrier packaged ICs.

3. The IC memory card according to claim 1 comprising non-memory ICs mounted on the substrate.

4. The IC memory card according to claim 1 wherein the substrate has pads formed on four sides, mounting the sub-modules to the substrate.

5. The IC memory card according to claim 1 wherein sub-module mounting pads are disposed along a pair of lines on the substrate.

6. The IC memory card according to claim 1 wherein each of the leads electrically connecting the sub-module to the substrate has an elastic retaining portion.

7. The IC memory card according to claim 1 wherein in each of the memory ICs is a tape carrier package IC.

8. The IC memory card according to claim 7 including non-memory ICs which are not tape carrier package ICs mounted on the substrate.

9. An IC memory card comprising:
    two sub-modules, each sub-module including a sub-substrate having two opposed surfaces and a plurality of memory ICs mounted on the two opposed surfaces of the sub-substrate;
    a substrate having an opening, the sub-modules being stacked on each other, disposed in the opening, and mounted on the substrate; and
    a connector mounted at an end of the substrate and electrically connected to said memory ICs for exchanging signals with an external device.

10. The IC memory card according to claim 9 wherein the substrate includes connecting pads and has a thickness, the memory ICs have a thickness substantially one-half the thickness of the substrate, and including connecting pads on the sub-substrate connected directly to the connecting pads on the substrate by solder.

11. The IC memory card according to claim 7 wherein memory ICs on the two sub-modules contact each other in the opening.

* * * * *